(12) United States Patent
Baba

(10) Patent No.: US 7,103,132 B1
(45) Date of Patent: Sep. 5, 2006

(54) PHASE COMPARATOR AND METHOD OF CONTROLLING POWER SAVING OPERATION OF THE SAME, AND SEMICONDUCTOR INTEGRATED CIRCUIT

(75) Inventor: Hiroshi Baba, Kagoshima (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/531,677

(22) Filed: Mar. 20, 2000

(30) Foreign Application Priority Data

Apr. 27, 1999 (JP) .......................................... 11-120620

(51) Int. Cl.
H03D 3/24 (2006.01)
H03L 7/26 (2006.01)

(52) U.S. Cl. ....................................... 375/376; 331/1 A
(58) Field of Classification Search ................. 375/376, 375/373–374, 371; 331/1 A, 16; 455/76, 455/574

See application file for complete search history.

(56) References Cited

U.S. PATENT DOCUMENTS

| | | | | | |
|---|---|---|---|---|---|
| 4,631,496 | A | * | 12/1986 | Borras et al. ................. | 331/1 A |
| 5,389,899 | A | * | 2/1995 | Yahagi et al. .................. | 331/10 |
| 5,410,571 | A | * | 4/1995 | Yonekawa et al. .......... | 375/376 |
| 5,541,929 | A | * | 7/1996 | Jokura ........................ | 370/337 |
| 5,548,250 | A | * | 8/1996 | Fang ............................ | 331/14 |
| 5,598,405 | A | * | 1/1997 | Hirose ........................ | 370/280 |
| 5,877,657 | A | * | 3/1999 | Yoshinaka .................... | 331/16 |
| 6,002,278 | A | * | 12/1999 | Saito ........................... | 327/115 |
| 6,173,025 | B1 | * | 1/2001 | Jokura ........................ | 375/376 |
| 6,314,150 | B1 | * | 11/2001 | Vowe ......................... | 375/374 |
| 6,518,845 | B1 | * | 2/2003 | Nakamichi .................... | 331/16 |

FOREIGN PATENT DOCUMENTS

| | | |
|---|---|---|
| JP | 10-041815 | 2/1998 |
| JP | 10-308667 | 11/1998 |
| JP | 2001-111420 | 4/2001 |

OTHER PUBLICATIONS

Office Action from Japanese Patent Office in the basic Japanese patent application No. 11–120620 mailed on Aug. 26, 2003.

* cited by examiner

*Primary Examiner*—Emmanuel Bayard
*Assistant Examiner*—Lawrence Williams
(74) *Attorney, Agent, or Firm*—Westerman, Hattori, Daniels & Adrian, LLP

(57) ABSTRACT

A power saving operation control method and device for a phase comparator unit are provided. The control device includes: a reference signal frequency dividing unit which divides the frequency of a reference signal to generate a reference frequency divided signal; a comparison signal frequency unit which divides an input signal to generate a comparison frequency divided signal; a phase comparator which compares the phases of the reference frequency divided signal and the comparison frequency divided signal; a canceling signal generator which generates a power saving state canceling signal in accordance with the reference frequency divided signal and the comparison frequency divided signal; a first initializing signal generator which generates a first initializing signal for initializing the reference signal frequency dividing unit in accordance with the power saving state canceling signal; and a second initializing signal generator which generates a second initializing signal for initializing the comparison signal frequency dividing unit in accordance with the power saving state canceling signal.

11 Claims, 15 Drawing Sheets

FIG. 5 PRIOR ART

|  | REFERENCE SIGNAL FREQUENCY DIVIDING UNIT | COMPARISON SIGNAL FREQUENCY DIVIDING UNIT |
|---|---|---|
| CN1 | 0 | 0 |
| CN2 | 0 | 1 |

US 7,103,132 B1

PHASE COMPARATOR AND METHOD OF CONTROLLING POWER SAVING OPERATION OF THE SAME, AND SEMICONDUCTOR INTEGRATED CIRCUIT

BACKGROUND OF THE INVENTION

1. Field of the Invention

The present invention generally relates to PLL frequency synthesizers, and, more particularly, to a method of controlling a phase comparator for performing a power saving operation and a semiconductor circuit.

2. Description of the Related Art

FIG. 1 is a block diagram of a conventional PLL frequency synthesizer. The PLL frequency synthesizer comprises a voltage control oscillator 102, a phase comparator unit 101, a low pass filter 106, and a microcomputer 108. The phase comparator unit 101 receives a comparison signal through an input terminal Fin and a reference signal through an input terminal OSCin. A capacitor 105 removes the DC component from the output of the voltage control oscillator 102 to obtain the comparison signal. A capacitor 104 removes the DC component from a reference frequency signal 103 to obtain the reference signal. The frequencies of the comparison signal and the reference signal are divided at respective frequency dividing rates, and the phases of both signals are compared. The phase comparator unit 101 then outputs through an output terminal Do a signal representing the phase difference between the comparison signal and the reference signal. The low pass filter 106 removes the high-frequency component from the phase difference signal and then inputs the phase difference signal into the voltage control oscillator 102 so as to control the oscillation frequency of the voltage control oscillator 102. The output signal 107 of the PLL frequency synthesizer is the output signal of the voltage control oscillator 102. The frequency of the output signal 107 can be varied at will by varying the frequency dividing rates inputted from the microcomputer 108 into the phase comparator unit 101 through its input terminals CLK, DT, and LE.

FIG. 2 is a block diagram of the phase comparator unit 101 of the conventional PLL frequency synthesizer of FIG. 1. The phase comparator unit 101 comprises a reference signal frequency dividing unit 202, a frequency divider 204, a comparison signal frequency dividing unit 205, a phase comparator 208, a charge pump 209, a power saving operation control circuit 212, and a control circuit 213. A reference signal 221 is inputted into a reference counter 203 of the reference signal frequency dividing unit 202 via an input buffer 201. After the frequency of the reference signal 221 is divided at a predetermined frequency dividing rate, the reference signal frequency dividing unit 202 supplies the divided reference signal to one of two input terminals of the phase comparator 208. After the frequency divider 204 divides the frequency of a comparison signal 222 at a predetermined frequency dividing rate, the comparison signal 222 is inputted into a swallow counter 206 and a main counter 207 of the comparison signal frequency dividing unit 205. The frequency of the comparison signal 222 is then divided again at a predetermined frequency dividing rate, and is inputted into the other input terminal of the phase comparator 208. The phase comparator 208 compares the phases of the two signals, and in accordance with the phase difference, outputs a phase difference signal 227 through the charge pump 209 and the output terminal Do. The output of the phase comparator 208 is also inputted into a digital lock detector 210, so that a lock signal 228 representing the phase synchronization state of the PLL frequency synthesizer is outputted through an LD terminal. An output select circuit 211, under the control of the control circuit 213, selects a monitor signal 229 from the two signals inputted into the phase comparator 208, and outputs the monitor signal 229 through an Fout terminal. The power saving operation control circuit 212 receives the output signal of the input buffer 201 and the output signal of the frequency divider 204, and controls the power saving operations of the reference signal frequency dividing unit 202, the comparison signal frequency dividing unit 205, the phase comparator 208, and the digital lock detector 210.

FIG. 3 is a timing chart of signals inputted into the control circuit 213. In this timing chart, Data DT is control data for controlling the phase comparator unit 101, and a clock CLK is a clock signal in synchronization with the bits of the data DT. The data DT is stored in the control circuit 213 only when a latch enable signal LE becomes high in synchronization with the clock CLK.

FIG. 4A shows an example structure of the control data inputted into the reference signal frequency dividing unit 202, and FIG. 4B shows an example structure of the control data inputted into the comparison signal frequency dividing unit 205. In both control data shown in FIGS. 4A and 4B, CN1 and CN2 indicate control bits for distinguishing between the control data for the reference signal frequency dividing unit 202 and the control data for the comparison signal frequency dividing unit 205. In FIG. 4A, bits 3, 4, 19, 20, 21, 22, and 23, each marked with ×, are dummy bits. In FIG. 4B, a bit 5 marked with × is a dummy bit. Both control data shown in FIGS. 4A and 4B are inputted one bit at a time, starting from the uppermost bit 23, at the timing shown in FIG. 3.

FIG. 5 shows the contents of the control bits CN1 and CN2. When both control bits CN1 and CN2 are "0", the bits 3 to 23 represent the control data for the reference signal frequency dividing unit 202. When the control bit CN1 is "0" and the control bit CN2 is "1", the bits 3 to 23 represent the control data for the comparison signal frequency dividing unit 205.

The bits 5 to 18 in FIG. 4A represent the control data for setting a frequency dividing rate "R" in the reference counter 203. The bits 6 to 12 in FIG. 4B represent the control data for setting a frequency dividing rate "A" in the swallow counter 206 of the comparison signal frequency dividing unit 205. The bits 13 to 23 in FIG. 4B represent the control data for setting a frequency dividing rate "N" in the main counter 207 of the comparison signal frequency dividing unit 205. The bit 4 in FIG. 4B represents the control data for setting a frequency dividing rate "P" in the frequency divider 204. Accordingly, the comparison signal frequency dividing unit 205 shown in FIG. 2 divides the frequency of a comparison signal at (P×N+A). The bit 3 in FIG. 4B represent control data for the digital lock detector 210 and the output select circuit 211.

FIG. 6 is a block diagram of the conventional power saving operation control circuit 212 shown in FIG. 2. A power saving restriction signal PSR is inputted into an inverter 601. When the power saving restriction signal PSR is low, a power saving operation is performed. When the power saving restriction signal PSR is high, the power saving operation is not performed. The output of the inverter 601 is inputted into an inverter 602. The output of the inverter 602 is inputted into one of the two input terminals of a NAND gate 603, the set terminal SET of a D-flip-flop 616, the reset terminal RESET of a D-flip-flop 617, and one of the two input terminals of a NAND gate 620 included in a set/reset flip-flop 621. NAND gates 619 and 620 constitute the set/reset flip-flop 621. An inverted signal XFPAR of the output signal of the frequency divider 204 is inputted into the D-input terminals of the D-flip-flops 616 and 617, and a first input terminal of a 3-input NAND gate 618. A reference signal FRAR is inputted into the other input terminal of the NAND gate 603.

Inverters 604-1 to 604-7 are cascaded, and the output terminal of the NAND gate 603 is connected to the input terminal of the inverter 604-1. The output terminal of the inverter 604-7 is connected to one of the two input terminals of a NAND gate 608. The output terminal of the NAND gate 608 is connected to the input terminal of an inverter 609, and the output terminal of the inverter 609 is connected to the input terminal of an inverter 610 and the clock input terminal CK of the D-flip-flop 616. The output terminal of the inverter 610 is connected to the inverted clock input terminal XCK of the D-flip-flop 616 and the input terminal of an inverter 611-1. Inverters 611-1 to 611-14 are cascaded, and the output of the inverter 611-14 is inputted into the input terminal of an inverter 615 and the inverted clock input terminal XCK of the D-flip-flop 617. The output of the inverter 615 is inputted into the clock input terminal CK of the D-flip-flop 617. The reset input terminal of the D-flip-flop 616 and the set input terminal of the D-flip-flop 617 are connected to a power source Vcc.

The inverted output XQ terminal of the D-flip-flop 616 is connected to a second input terminal of the 3-input NAND gate 618, and the output Q terminal of the D-flip-flop 617 is connected to a third input terminal of the 3-input NAND gate 618. The output of the 3-input NAND gate 618 is inputted into one of the two input terminals of the NAND gate 619 included in the set/reset flip-flop 621. The output of the NAND gate 620 included in the set/reset flip-flop 621 is inputted into the other input terminal of the NAND gate 608, the other input terminal of the NAND gate 619, and the input terminal of an inverter 622. The inverter 622 outputs an internal power saving restriction signal PSRS.

FIG. 7 is a timing chart of signals in the operation of the conventional power saving operation control circuit 212 of FIG. 6. When the power saving restriction signal PSR is low, the D-flip-flop 616 is set, the D-flip-flop 617 is reset, and the output of the NAND gate 620 is high. Ten gates after the reference signal FRAR rises as the power saving restriction signal PSR becomes high, the output CK1 of the inverter 609 rises from the low-level to the high-level. At the rise of the output CK1 of the inverter 609, the D-flip-flop 616 stores the inverted signal XFPAR of the output of the frequency divider 204, and outputs a high-level signal XQ1 through the inverted output terminal XQ. Sixteen gates after the rise of the output CK1 of the inverter 609, the output CK2 of the inverter 615 rises. At the rise of the output CK2, the D-flip-flop 617 stores the inverted signal XFPAR of the output of the frequency divider 204, and outputs a high-level signal Q2 through the output terminal Q. The output A of the 3-input NAND gate 618 becomes low, when the inverted signal XFPAR and the signals XQ1 and Q2 are all high. Accordingly, the output B of the NAND gate 619 becomes high, and the output C of the set/reset flip-flop 621 becomes low. As a result, the internal power saving restriction signal PSRS becomes high, thereby canceling the power saving state.

FIG. 8 is a flowchart of a power saving state canceling operation of the power saving operation control circuit 212. In step S1-1, the power saving restriction signal PSR rises to the high level. In step S1-2, it is determined whether the inverted signal XFPAR is high or low at the rise of the output signal CK1 of the inverter 609. If the inverted signal XFPAR is low, the operation moves on to step S1-3, in which it is determined whether the inverted signal XFPAR is high or low at the rise of the output signal CK2 of the inverter 615. If the inverted signal XFPAR is high, the operation moves on to step S1-4, in which the internal power saving state is canceled. In step S1-5, the power saving state is canceled in the reference counter 203 of the reference signal frequency dividing unit 202, the swallow counter 206 and the main counter 207 of the comparison signal-frequency dividing unit 205, and the phase comparator 208. The phase difference signal 227 is then outputted through the charge pump 209.

However, there are problems with the prior art described above. FIG. 9 illustrates a first problem of the power saving operation control circuit 212 of the prior art. The first problem is that a power saving state might be wrongly canceled due to noise. The noise is caused when a power saving state is canceled as the power saving restriction signal PSR is changes from the low level to the high level. The noise enters the reference signal FRAR and the inverted signal XFPAR of the output of the frequency divider 104. Because of this, the internal power saving restriction signal PSRS outputted from the power saving operation control circuit 212 becomes high, thereby promptly switching on the internal circuits of the phase comparator unit 101 including the reference signal frequency dividing unit 202, the comparator signal frequency dividing unit 205, and the phase comparator 208. As a result, the phases of the reference signal FRAR and the inverted signal XFPAR of the output of the frequency divider 204 are greatly shifted in relation to each other.

FIG. 10 illustrates a second problem of the power saving operation control circuit 121 of the prior art. The second problem is that, when the power saving restriction signal PSR changes from the low level to the high level to cancel a power saving state, the phase difference between the reference signal FRAR and the inverted signal XRPAR becomes constant. With the phase difference between the two signals being constant, the internal power saving restriction signal PSRS can never become high. As a result, the internal circuits of the phase comparator unit 101, including the reference signal frequency dividing unit 202, the comparison signal frequency dividing unit 205, and the phase comparator 208, are not actuated.

SUMMARY OF THE INVENTION

A general object of the present invention is to provide power saving operation control methods and devices, in which the above disadvantages are eliminated.

A more specific object of the present invention is to provide a power saving operation control method and a power saving operation control device for phase comparators, in which canceling of a power saving state can be accurately and stably carried out.

The above objects of the present invention are achieved by a method of controlling a power saving operation for a phase comparator unit, comprising the steps of:

dividing the frequency of a reference signal to generate a reference frequency divided signal;

dividing the frequency of an input signal to generate a comparison frequency divided signal whose phase is to be compared with the phase of the reference frequency divided signal;

comparing the phases of the reference frequency divided signal and the comparison frequency divided signal so as to output a comparison result;

generating a power saving state canceling signal in accordance with the reference frequency divided signal and the comparison frequency divided signal;

generating a first initializing signal for initializing the output of the step of dividing the frequency of a reference signal in accordance with the power saving state canceling signal; and generating a second initializing signal for initializing the output of the step of dividing the frequency of an input signal in accordance with the power saving state canceling signal.

According to the above method, when a change is detected in the outputs of the step of dividing the frequency of a reference signal and the step of dividing the frequency of an input signal, the step of dividing the frequency of a reference signal is reset in accordance with the first initializing signal, and the step of dividing the frequency of an input signal is reset in accordance with the second initializing signal. By doing so, the phase difference between the two signals inputted into the phase comparator in a power saving cancelled state becomes smaller than a predetermined value. Accordingly, accurate and stable canceling of a power saving state can be carried out. By the above method of the present invention, a power saving state is not wrongly canceled due to noise or the like when the phase difference of internal signals is greater than the predetermined value. Also, wrong canceling of a power saving state due to the relationship between the timing of a power saving restriction signal rise and the phases of the reference signal and the output of the frequency divider can be prevented.

The above objects of the present invention are also achieved by a power saving operation control circuit for a phase comparator unit, comprising:

a reference signal frequency dividing unit which divides the frequency of a reference signal to generate a reference frequency divided signal;

a comparison signal dividing unit which divides the frequency of an input signal to generate a comparison frequency divided signal whose phase is to be compared with a phase of the reference frequency divided signal;

a phase comparator which compares the phases of the reference frequency divided signal and the comparison frequency divided signal so as to output a comparison result;

a canceling signal generator which generates a power saving state canceling signal in accordance with the reference frequency divided signal and the comparison frequency divided signal;

a first initializing signal generator which generates a first initializing signal for initializing the reference signal frequency dividing unit in accordance with the power saving state canceling signal; and a second initializing signal generator which generates a second initializing signal for initializing the comparison signal frequency dividing unit in accordance with the power saving state canceling signal.

In the above power saving operation control circuit, when a change is detected in the outputs of the reference signal frequency dividing unit and the comparison signal frequency dividing unit, the reference signal frequency dividing unit is reset in accordance with the first initializing signal, and the comparison signal frequency dividing unit is reset in accordance with the second initializing signal. By doing so, the phase difference between the two signals inputted into the phase comparator in a power saving cancelled state becomes smaller than a predetermined value. Accordingly, accurate and stable canceling of a power saving state can be carried out. Thus, a power saving state is not wrongly canceled due to noise or the like when the phase difference of internal signals is greater than the predetermined value. Also, wrong canceling of a power saving state due to the relationship between the timing of a power saving restriction signal rise and the phases of the reference signal and the output of the frequency divider can be prevented.

The above objects of the present invention are also achieved by a PLL frequency synthesizer comprising:

a phase comparator unit;

a loop filter which receives the output of the phase comparator unit; and a voltage control oscillator which receives the output of the loop filter, the phase comparator unit comprising:

a reference signal frequency dividing unit which divides the frequency of a reference signal to generate a reference frequency divided signal;

a comparison signal dividing unit which divides the frequency of an output signal of the voltage oscillator to generate a comparison frequency divided signal whose phase is to be compared with the phase of the reference frequency divided signal;

a phase comparator which compares the phases of the reference frequency divided signal and the comparison frequency divided signal so as to output a comparison result;

a canceling signal generator which generates a power saving state canceling signal in accordance with the reference frequency divided signal and the comparison frequency divided signal;

a first initializing signal generator which generates a first initializing signal for initializing the reference signal frequency dividing unit in accordance with the power saving state canceling signal; and a second initializing signal generator which generates a second initializing signal for initializing the comparison signal frequency dividing unit in accordance with the power saving state canceling signal.

With this PLL frequency synthesizer, the same effects as with the power saving operation control circuit of the present invention can be obtained.

The above objects of the present invention are also achieved by a semiconductor integrated circuit including the above PLL frequency synthesizer.

With this semiconductor integrated circuit, the same effects as with the power saving operation control circuit of the present invention can be obtained.

The above objects of the present invention are also achieved by a transmitter-receiver including the above PLL frequency synthesizer.

With this transmitter-receiver, the same effects as with the power saving operation control circuit of the present invention can be obtained.

The above and other objects and features of the present invention will become more apparent from the following description taken in conjunction with the accompanying drawings.

BRIEF DESCRIPTION OF THE DRAWINGS

FIG. 5 shows the contents of control bits of the control data shown in FIGS. 4A and 4B;

DESCRIPTION OF THE PREFERRED EMBODIMENTS

The following is a description of embodiments of the present invention, with reference to the accompanying drawings.

Figure 2:
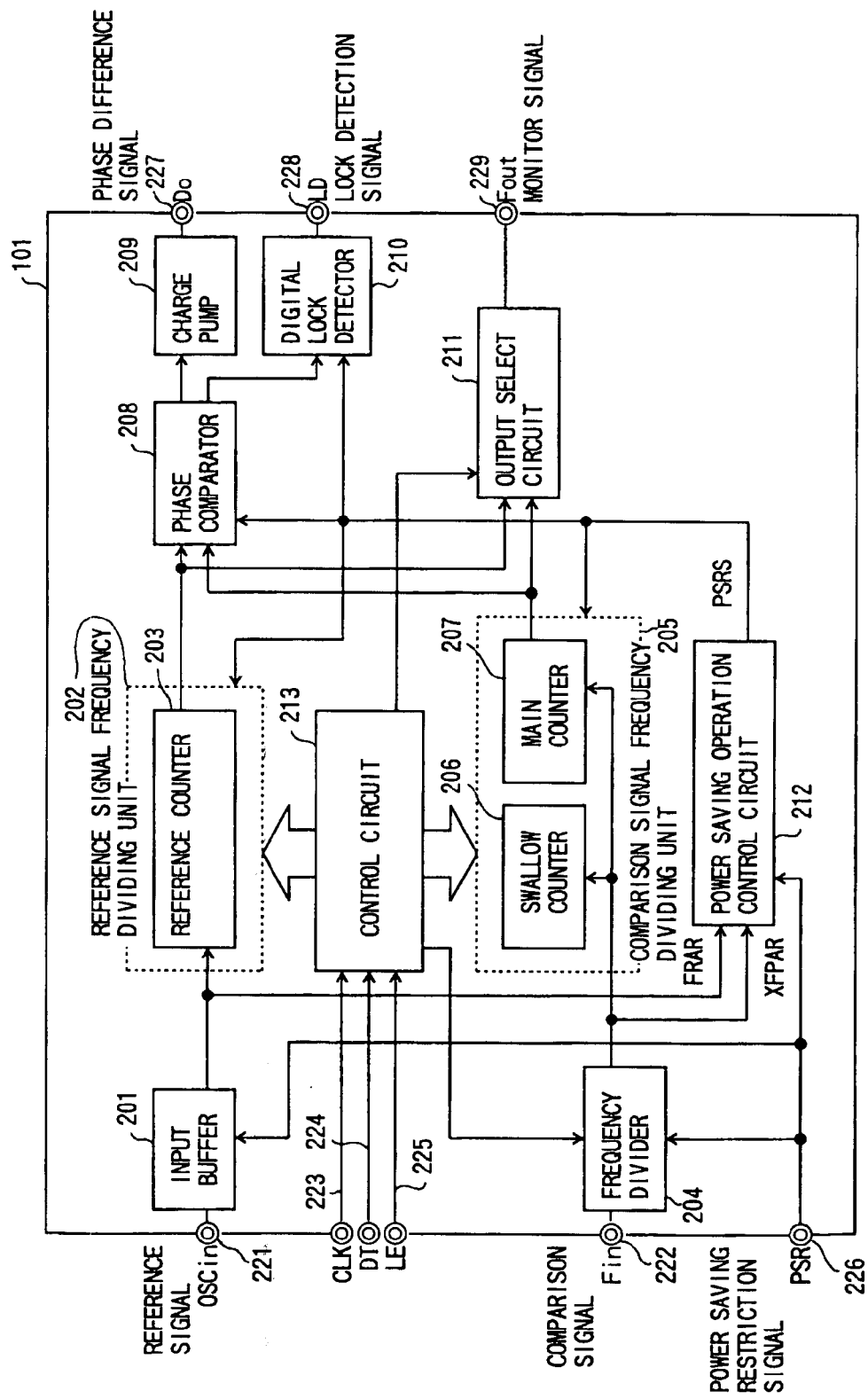
FIG. 2 is a block diagram of a phase comparator unit of the conventional PLL frequency synthesizer of FIG. 1.
Figure 3:
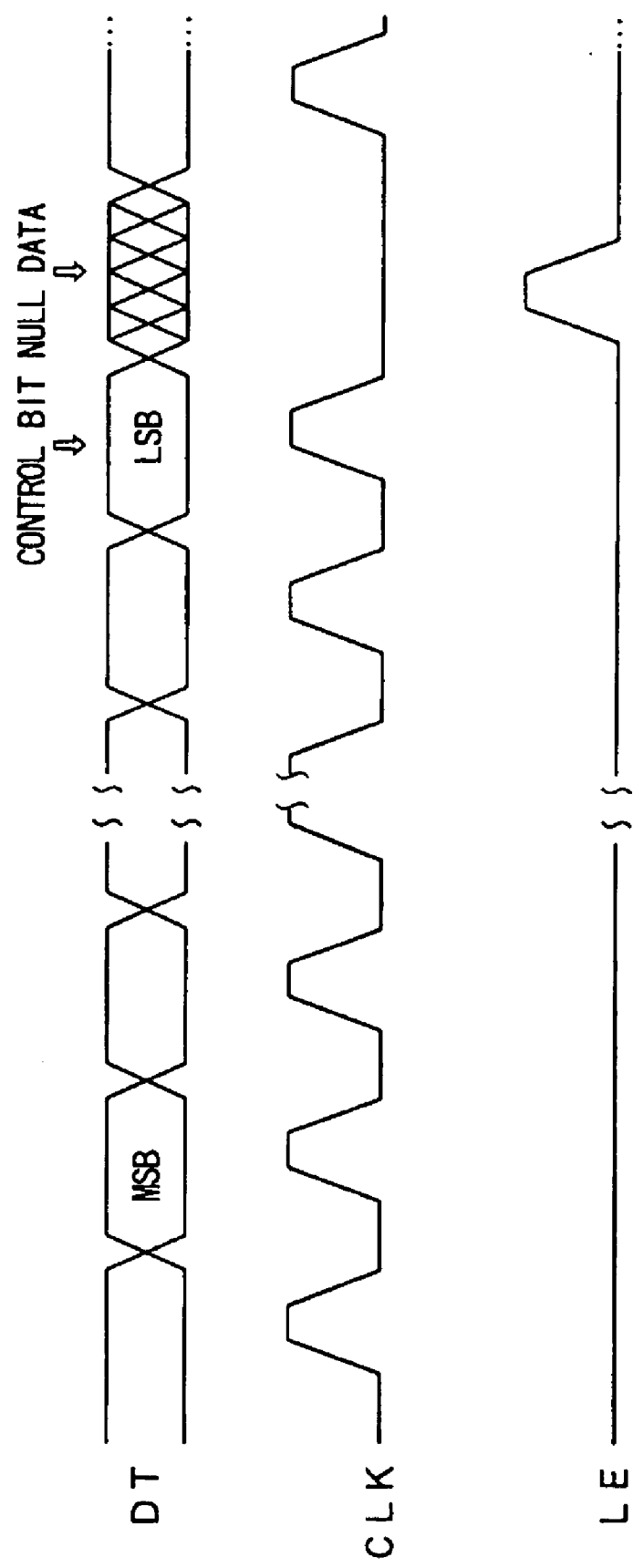
FIG. 3 is a timing chart of signals inputted into a control circuit of the phase comparator unit of FIG. 2.
Figure 4A:
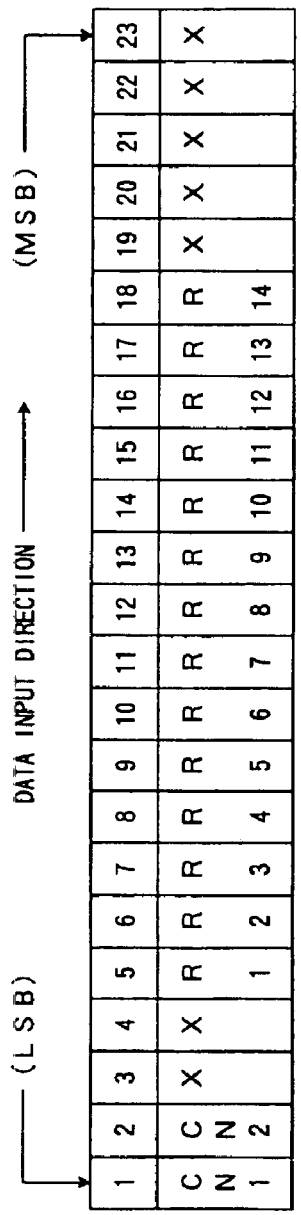
FIG. 4A shows an example structure of control data inputted into a reference signal frequency dividing unit of the conventional phase comparator unit of FIG. 2.
Figure 4B:
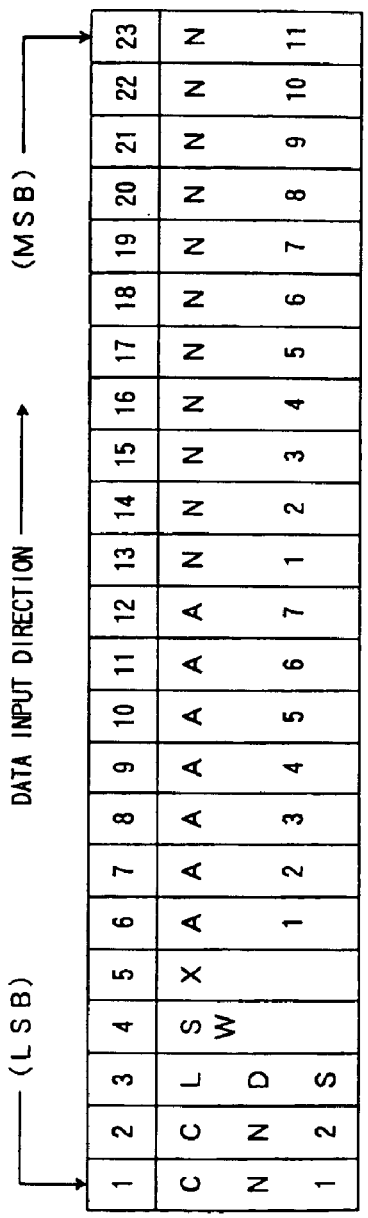
FIG. 4B shows an example structure of control data inputted into a comparison signal frequency dividing unit of the conventional phase comparator unit of FIG. 2.
Figure 6:
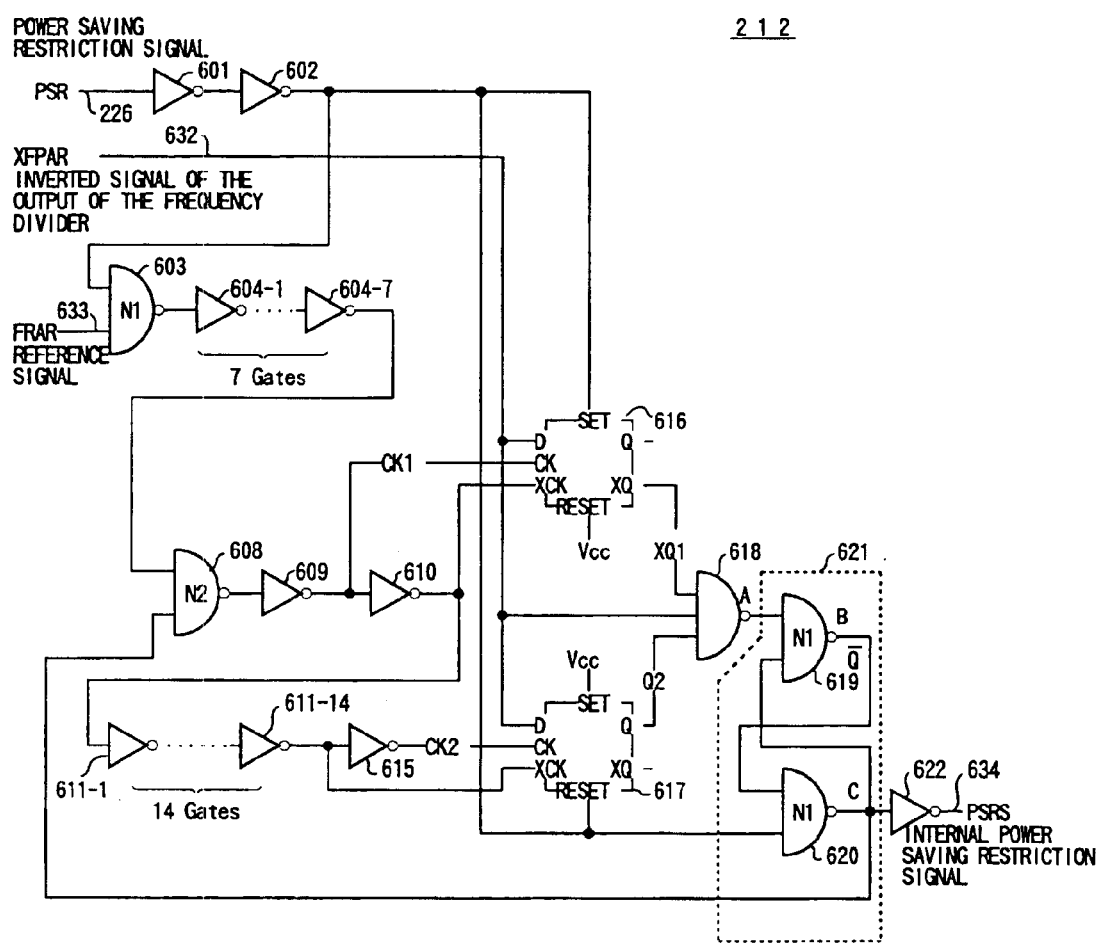
FIG. 6 is a block diagram of a power saving operation control circuit of the conventional phase comparator unit of FIG. 2.
Figure 7:
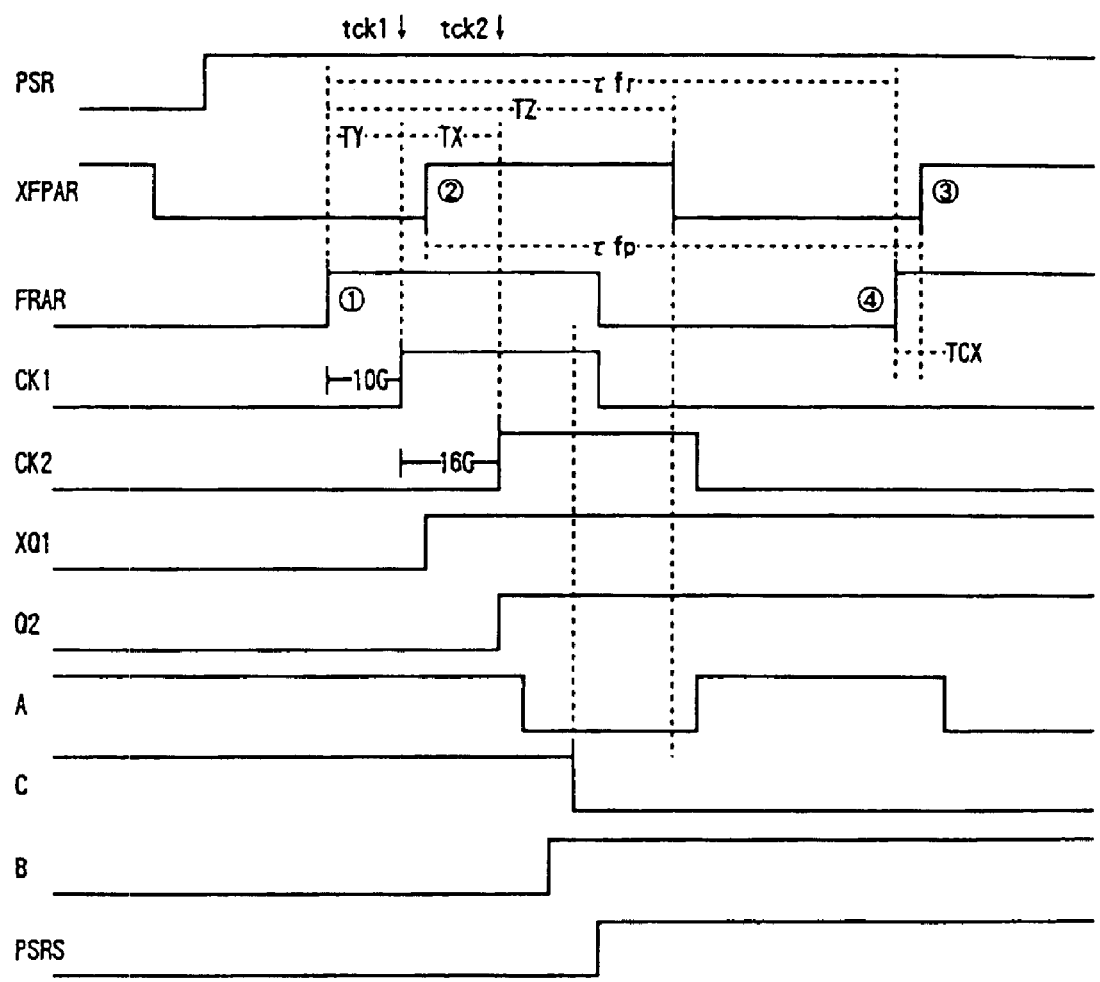
FIG. 7 is a timing chart of signals in the operation of the power saving operation control circuit of FIG. 6.
Figure 8:
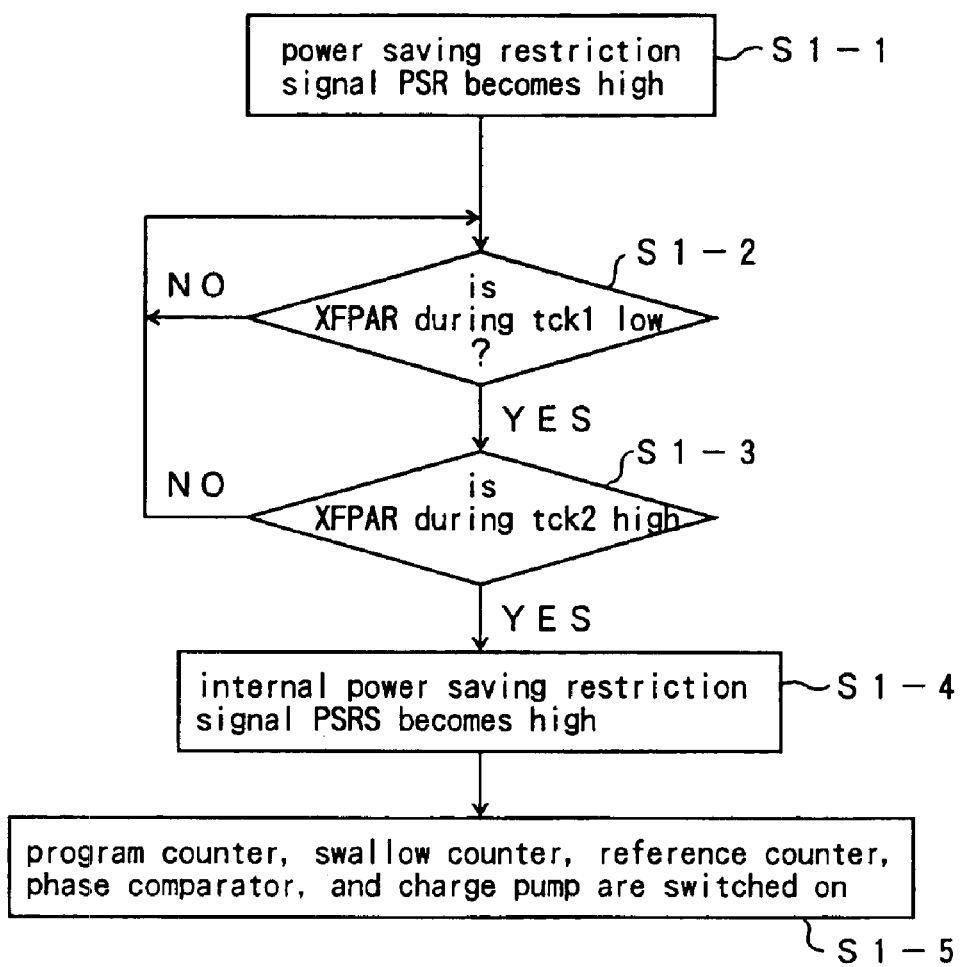
FIG. 8 is a flowchart of a power saving state canceling operation of the power saving operation control circuit of FIG. 6.
Figure 9:
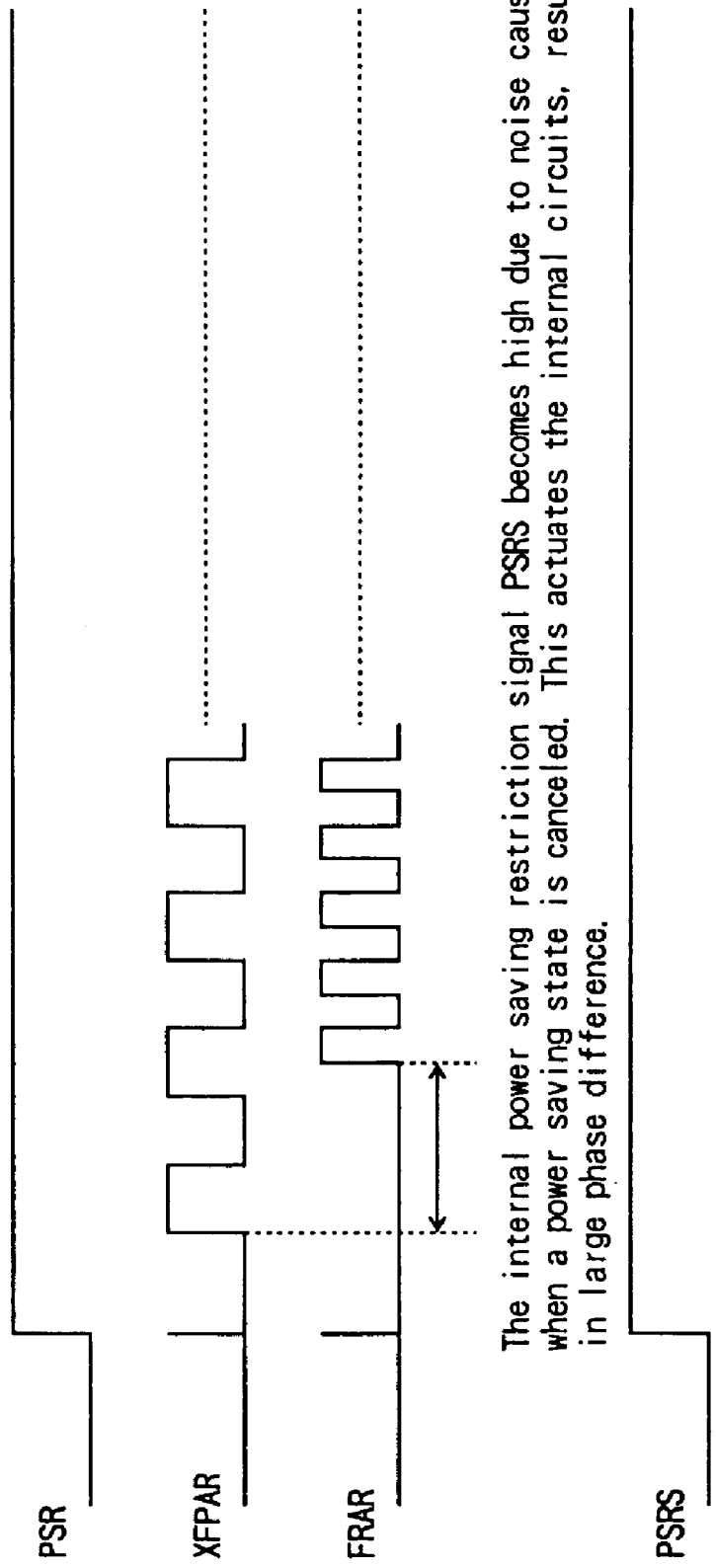
FIG. 9 illustrates a first problem of the conventional phase comparator unit.
Figure 10:
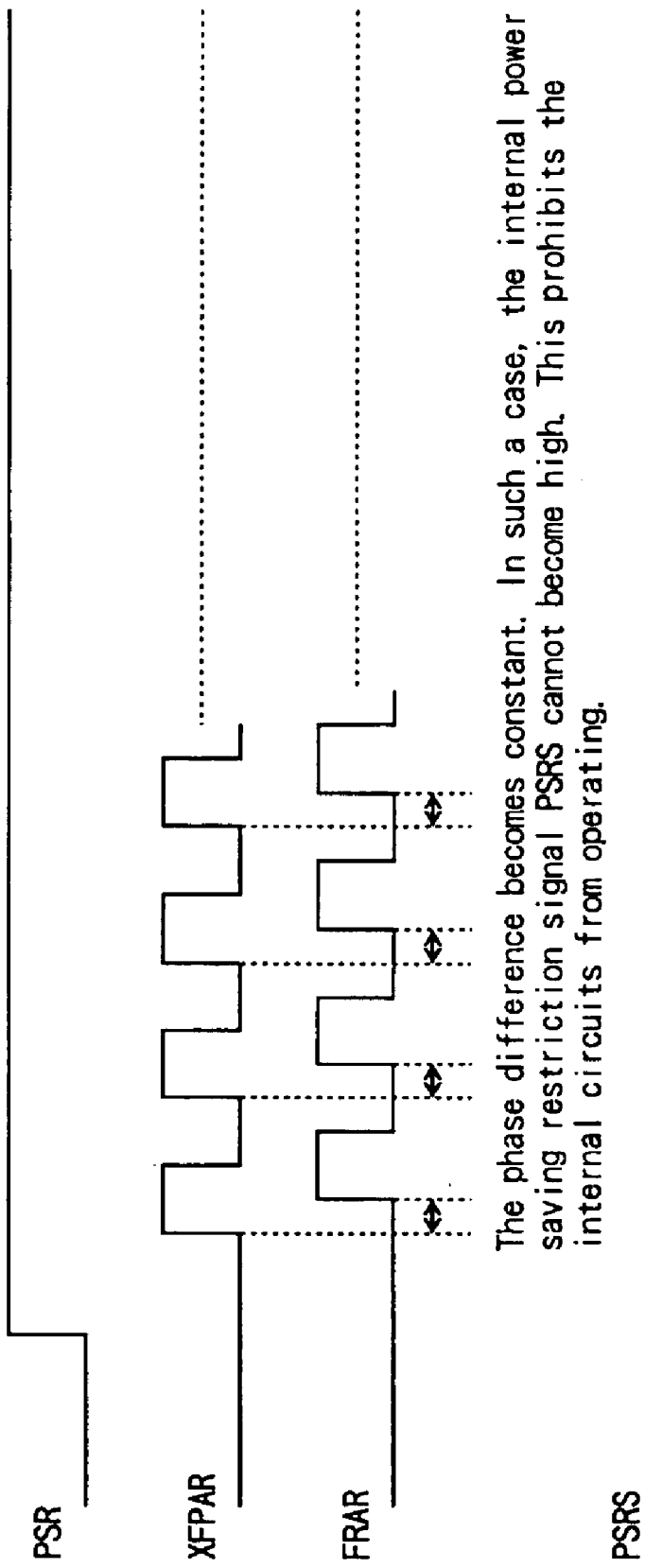
FIG. 10 illustrates a second problem of the conventional phase comparator unit.
Figure 11:
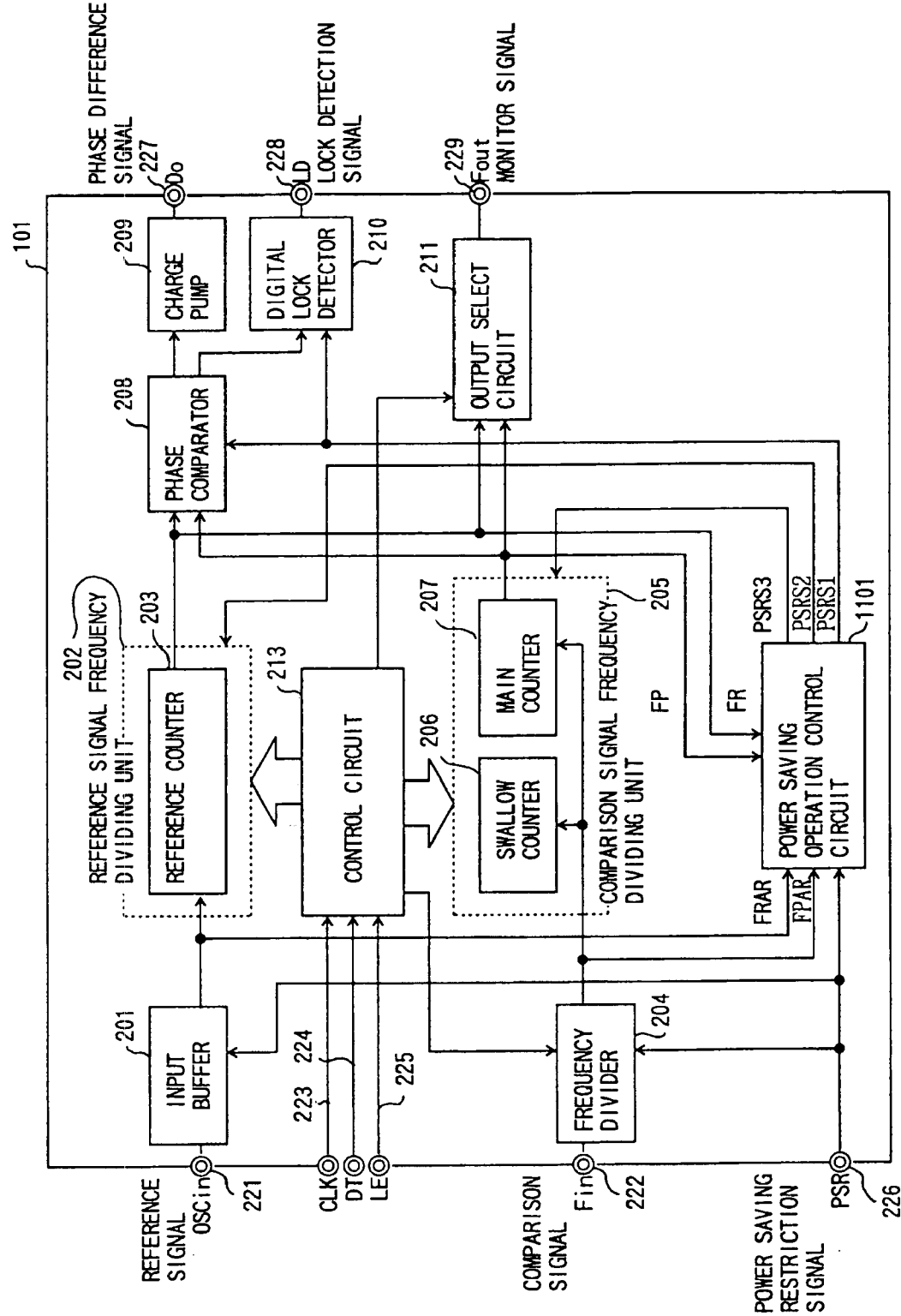
FIG. 11 is a block diagram of a phase comparator unit of the present invention.

FIG. 11 shows a phase comparator unit 101 of a first embodiment of the present invention. In this figure, the same components as in FIG. 2 are denoted by the same reference numerals. A power saving operation control circuit 1101 of this embodiment generates internal power saving restriction signals PSRS1, PSRS2, and PSRS3, based on the reference signal FRAR, the output signal FPAR of the frequency divider 204, the output signal FR of the reference signal frequency dividing unit 202, and the output signal FP of the comparison signal frequency dividing unit 205.

Figure 12:
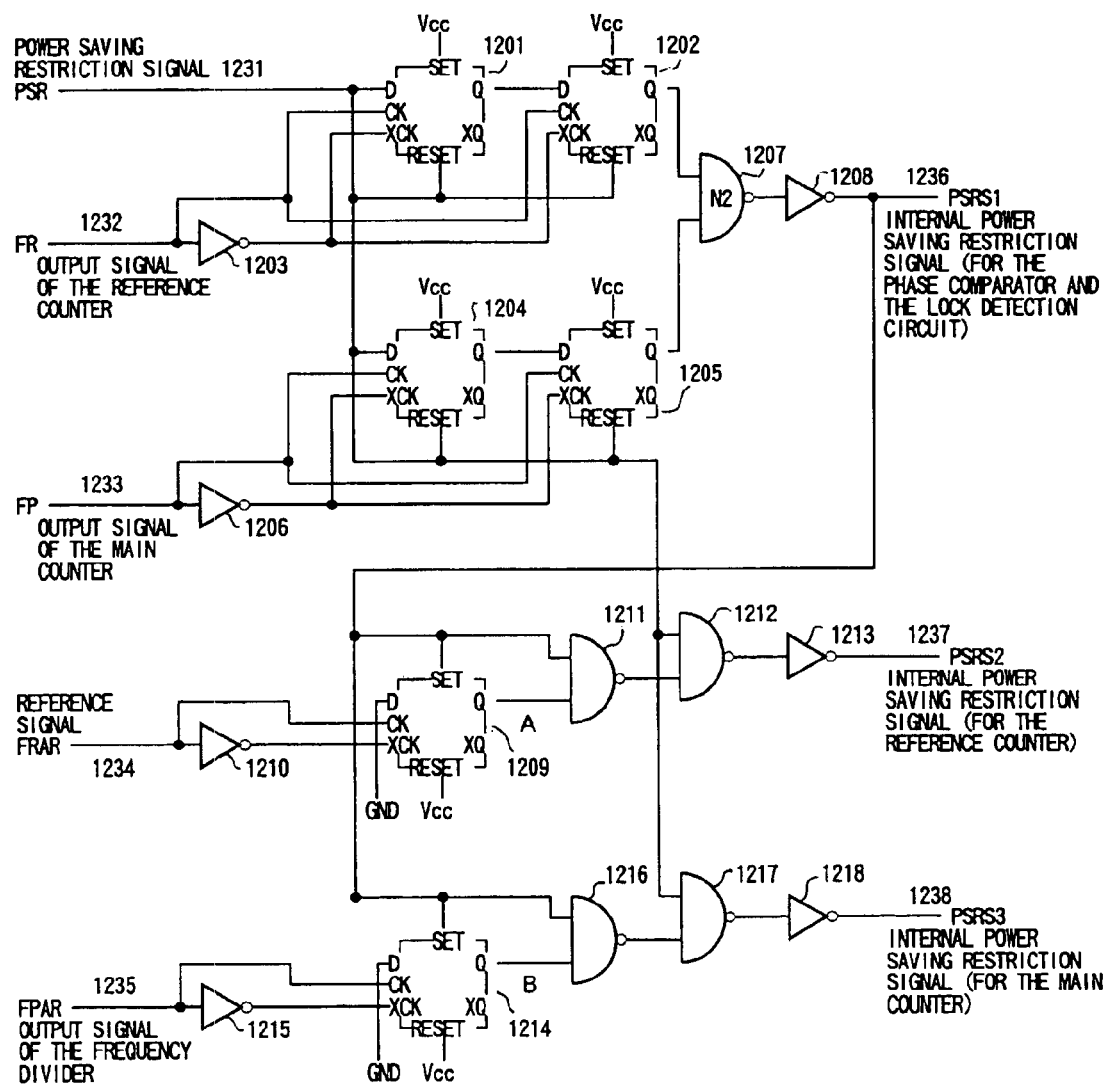
FIG. 12 is a block diagram of a power saving operation control circuit of the present invention.

FIG. 12 shows the power saving operation control circuit 1101 of the present invention. When a power saving restriction signal (PSR) 1231 is low, the power saving operation is performed. When the power saving restriction signal 1231 becomes high, the power saving state is canceled. The power saving restriction signal 1231 is supplied to the D-input terminal and the reset terminal RESET of a D-flip-flop 1201, the reset terminal RESET of a D-flip-flop 1202, the D-input terminal and the reset terminal RESET of a D-flip-flop 1204, the reset terminal RESET of a D-flip-flop 1205, one of the two input terminals of a NAND gate 1212, and one of the two input terminals of a NAND gate 1217.

The output signal (FR) 1232 of the reference counter 203 is supplied to the input terminal of an inverter 1203, the clock input terminal CK of the D-flip-flop 1201, and the clock input terminal CK of the D-flip-flop 1202. The output of the inverter 1203 is supplied to the inverted clock input terminal XCK of the D-flip-flop 1201 and the inverted clock input terminal XCK of the D-flip-flop 1202. The output Q of the D-flip-flop 1201 is supplied to the data D input terminal of the D-flip-flop 1202.

The output signal (FP) 1233 of the main counter 207 is supplied to the input terminal of an inverter 1206, the clock input terminal CK of the D-flip-flop 1204, and the clock input terminal CK of the D-flip-flop 1205. The output of the inverter 1206 is supplied to the inverted clock input terminal XCK of the D-flip-flop 1204 and the inverted clock input terminal XCK of the D-flip-flop 1205. The output Q of the D-flip-flop 1204 is supplied to the data D input terminal of the D-flip-flop 1205.

The output Q of the D-flip-flop 1202 is supplied to one of the input terminals of a NAND gate 1207, and the output Q of the D-flip-flop 1205 is supplied to the other input terminal of the NAND gate 1207. The output of the NAND gate 1207 is supplied to the input terminal of an inverter 1208. The output of the inverter 1208 is an internal power saving restriction signal (PSRS1) 1236. The set terminals SET of the D-flip-flops 1201, 1202, 1204, and 1205 are connected to a power source Vcc.

The reference signal FRAR is supplied to the input terminal of an inverter 1210 and the clock input terminal CK of a D-flip-flop 1209. The output of the inverter 1210 is supplied to the inverted clock input terminal XCK of the D-flip-flop 1209. The output Q of the D-flip-flop 1209 is supplied to one of the input terminals of a NAND gate 1211. The reset terminals RESET of the D-flip-flop 1209 is connected to the power source Vcc, and the data D input terminal of the D-flip-flop 1209 is connected to the ground GND. The set terminal SET of the D-flip-flop 1209 and the other input terminal of the NAND gate 1211 are connected to the output of the inverter 1208. The output of the NAND gate 1211 is supplied to the other input terminal of the NAND gate 1212. The output of the NAND gate 1212 is supplied to the input terminal of an inverter 1213. The output of the inverter 1213 is an internal power saving restriction signal (PSRS2) 1237.

The output signal (FPAR) 1235 of the frequency divider 204 is supplied to the input terminal of an inverter 1215 and the clock input terminal CK of a D-flip-flop 1214. The output of the inverter 1215 is supplied to the inverted clock input terminal XCK of the D-flip-flop 1214. The output Q of the D-flip-flop 1214 is supplied to one of the input terminals of a NAND gate 1216. The reset terminal RESET of the D-flip-flop 1214 is connected to the power source Vcc, and the data D input terminal of the D-flip-flop 1214 is connected to the ground GND. The set terminal SET of the D-flip-flop 1214 and the other input terminal of the NAND gate 1216 are connected to the output of the inverter 1208. The output of the NAND gate 1216 is supplied to the other input terminal of the NAND gate 1217. The output of the NAND gate 1217 is supplied to the input terminal of an inverter 1218. The output of the inverter 1218 is an internal power saving restriction signal (PSRS3) 1238.

Figure 13:
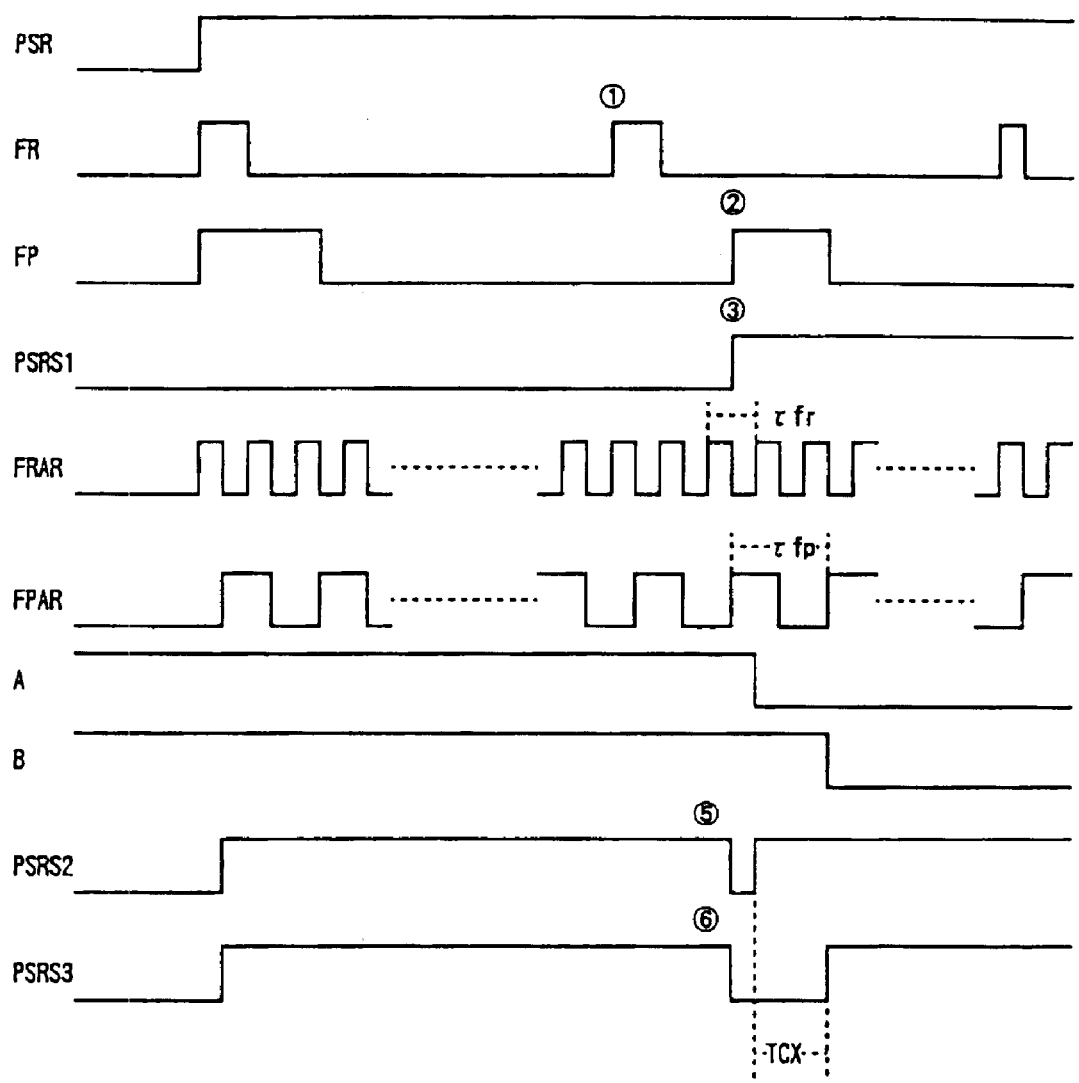
FIG. 13 is a timing chart of signals in the power saving operation control circuit of the present invention.

FIG. 13 is a timing chart of signals in the power saving operation control circuit of the present invention. When the power saving restriction signal PSR is low, the D-flip-flops 1201, 1202, 1204, and 1205 are in a reset state, the D-flip-flops 1209 and 1214 are in a set state, and the internal power saving restriction signals PSRS1, PSRS2, and PSRS3 are low. When the power saving restriction signal PSR changes from the low level to the high level, the reference counter 203 of the reference signal frequency dividing unit 202, and the swallow counter 206 and the main counter 207 of the counter signal frequency dividing unit 205 start operating, thereby outputting the frequency-divided outputs FR and FP. After the frequency-divided output FR of the reference counter 203 is outputted twice and the frequency-divided output FP of the swallow counter 206 and the main counter 207 is also outputted twice, the internal power saving restriction signal PSRS1 changes from the low level to the high level.

As the internal power saving restriction signal PSRS1 becomes high, the set terminal SET of the D-flip-flop 1209 becomes high, thereby canceling the set state of the D-flip-flop 1209. After that, when the reference signal FRAR rises, the output A of the D-flip-flop 1209 becomes low. The internal power saving restriction signal PSRS2 is low during the period from the time when the internal power saving restriction signal PSRS1 becomes high until the output A of the D-flip-flop 1209 becomes low. When the internal power saving restriction signal PSRS1 becomes high, the set terminal SET of the D-flip-flop 1214 also becomes high, thereby canceling the set state of the D-flip-flop 1214. When the output signal FPAR of the frequency divider 204 rises after the canceling of the set state of the D-flip-flop 1214, the output B of the D-flip-flop 1214 becomes low. The internal power saving restriction signal PSRS3 is low during the period from the time when the internal power saving restriction signal PSRS1 becomes high until the output B of the D-flip-flop 1214 becomes low. The internal power saving restriction signal PSRS2 resets the reference counter 203 of the reference signal frequency dividing unit 202, and the internal power saving restriction signal PSRS3 resets the swallow counter 206 and the main counter 207 of the comparison signal frequency dividing unit 205. The difference TCX between the low-level period of the internal power saving restriction signal PSRS2 and the low-level period of the internal power saving restriction signal PSRS3 is equal to or shorter than the cycle $\tau|\rho$ of the output signal FPAR of the frequency divider 204 or the cycle $\tau|\Gamma$ of the reference signal FRAR, whichever is longer.

Figure 14:
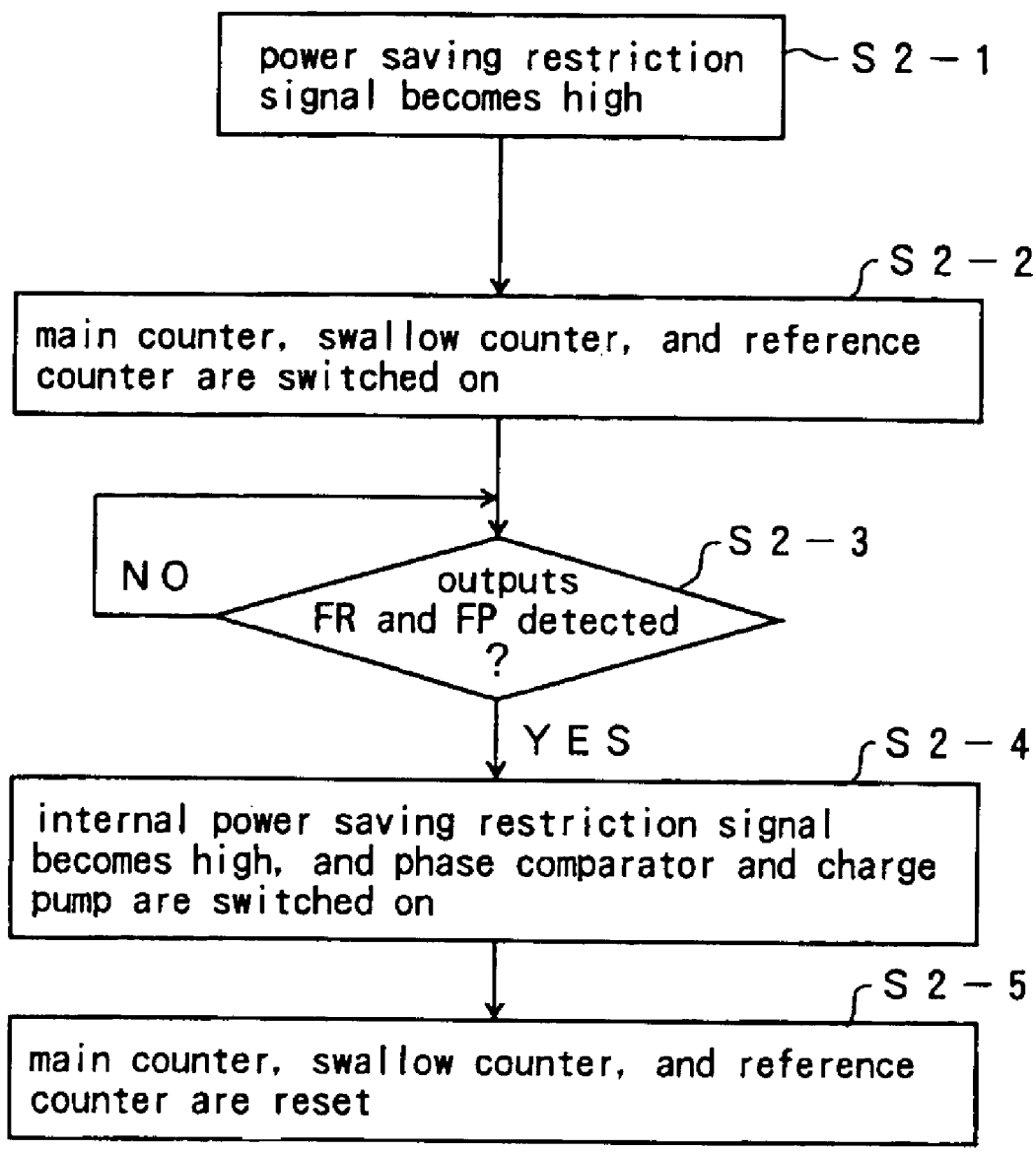
FIG. 14 is a flowchart of a power saving state canceling operation of the power saving operation control circuit of the present invention.

FIG. 14 is a flowchart of the power saving state canceling operation of the power saving operation control circuit of the present invention. In step S2-1, the power saving restriction signal PSR becomes high. In step S2-2, the reference counter 203, the swallow counter 206, and the main counter 207 are switched on. In step S2-3, it is determined whether the output FR of the reference counter 203 and the output FP of the swallow counter 206 and the main counter 207 are outputted. If both outputs FR and FP are outputted, the internal power saving restriction signal PSRS 1 becomes high, the power saving state of the phase comparator 208 is canceled, and the phase difference signal 227 is outputted through the charge pump 209 in step S2-4. In step S2-5, the internal power saving signals PSRS2 and PSRS3 are outputted so that the reference counter 203, the swallow counter 206, and the main counter 207 are reset.

Figure 1:
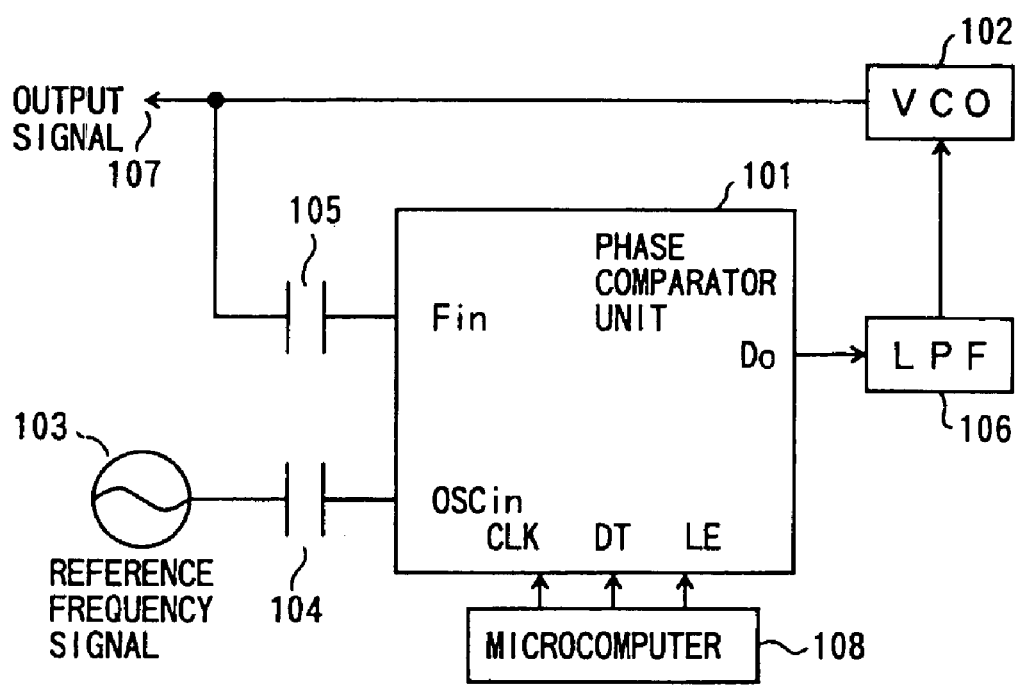
FIG. 1 is a block diagram of a conventional PLL frequency synthesizer.

As described above, when a change is detected in the outputs of the reference signal frequency dividing unit 202 constituted by the reference counter 203 and the counter signal frequency dividing unit 205 constituted by the swallow counter 206 and the main counter 207, the reference signal frequency dividing unit 202 is reset in accordance with the internal power saving restriction signal PSRS2, and the comparison signal frequency dividing unit 205 is reset in accordance with the power saving restriction signal PSRS3. By doing so, the phase difference between the two signals inputted into the phase comparator 208 in a power saving cancelled state becomes smaller than a predetermined value. Accordingly, accurate and stable canceling of a power saving state can be carried out. Thus, a power saving state is not wrongly canceled due to noise or the like when the phase difference of internal signals is greater than the predetermined value. Also, wrong canceling of a power saving state due to the relationship between the timing of a power saving restriction signal rise and the phases of the reference signal and the output of the frequency divider can be prevented. If the phase comparator unit 101 of the PLL frequency synthesizer of FIG. 1 is replaced with the phase comparator unit of the present invention, the frequency dividing rate R of the reference counter 203, the frequency dividing rate A of the swallow counter 206, and the frequency dividing rate N of the main counter 207 can be set in accordance with the signals DT, CLK, and LE. Thus, output signals having desired frequencies can be readily obtained, and a power saving state is not wrongly canceled due to noise.

Figure 15:
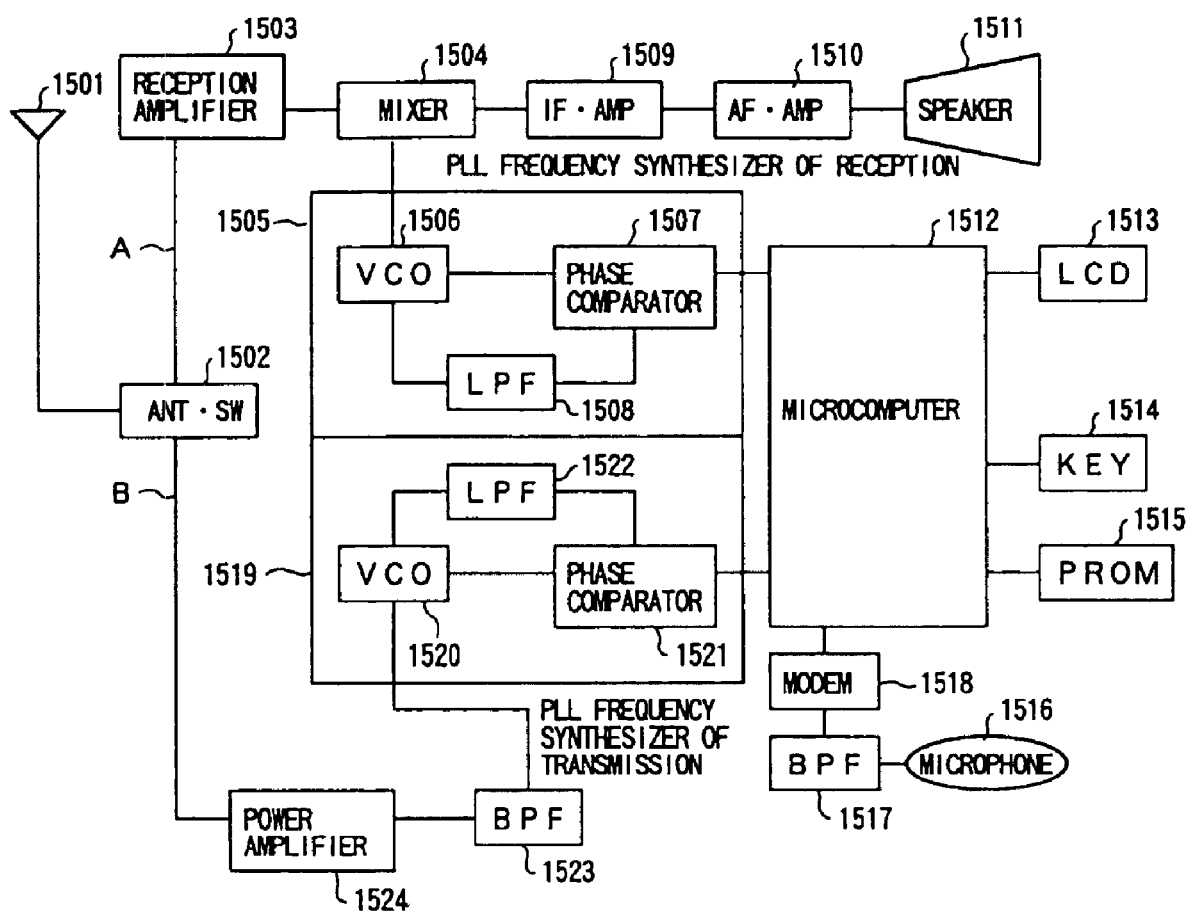
FIG. 15 is a block diagram of a transmitter-receiver in accordance with the present invention.

FIG. 15 shows a transmitter-receiver in accordance with a second embodiment of the present invention.

At the time of reception, following a program stored in a PROM 1515, a microcomputer 1512 captures a receiving channel designated by a KEY 1514. The microcomputer 1512 then sets a frequency of a PLL frequency synthesizer 1505 of a reception unit of the present invention. The setting of the frequency is carried out by setting the frequency dividing rates of the reference counter of the reference signal frequency dividing unit, and the swallow counter and the main counter of the comparison signal frequency dividing unit in the phase comparator unit. The receiving channel designated by the KEY 1514 and a receiving condition are displayed on a liquid crystal display (LCD) 1513. An antenna 1501 receiving a reception signal sends the reception signal to an antenna switch 1502. The antenna switch 1502 sends a signal from the antenna 1501 to the side A, when the transmitter-receiver is in a receiving state. Receiving the signal from the antenna switch 1502, a reception amplifier 1503 amplifies the weak signal. The amplified signal is then supplied to a mixer 1504, and is mixed with an output signal generated from the PLL frequency synthesizer 1505 of the reception unit. The PLL frequency synthesizer 1505 comprises a voltage control oscillator (VCO) 1506, a phase comparator unit 1507 of the present invention, and a low pass filter (LPF) 1508. In accordance with a power saving operation control signal, the PLL frequency synthesizer 1505 performs the power saving operation control. The output of the mixer 1504 is amplified by an IF amplifier 1509, and is further amplifier by an audio frequency (AF) amplifier 1510. The amplified output of the mixer 1504 is converted into sound and outputted through a speaker 1511.

At the time of transmission, following a program stored in the PROM 1515, the microcomputer 1512 captures a transmission channel designated by the KEY 1514. The microcomputer 1512 then sets the frequency of a PLL frequency synthesizer 1519 of a transmission unit of the present invention. The setting of the frequency is carried out by setting the frequency dividing rates of the reference counter of the reference signal frequency dividing unit, and the swallow counter and the main counter of the comparison signal frequency dividing unit in the phase comparator unit. The transmission channel designated by the KEY 1514 and a transmission condition are displayed on the liquid crystal display (LCD) 1513. Sound inputted through a microphone 1516 is subjected to band limitation in a band pass filter (BPF) 1517. The audio signal is then sent to the microcomputer 1512 via a MODEM 1518. In accordance with the audio signal, the microcomputer 1512 controls the frequency of a signal generated from the PLL frequency synthesizer 1519 of the transmitter unit of the present invention. The PLL frequency synthesizer 1519 of the transmission unit comprises a voltage control oscillator (VCO) 1520, a phase comparator unit 1521 of the present invention, and a low pass filter (LPF) 1522. In accordance with a power saving operation control signal supplied from the microcomputer 1512, the PLL frequency synthesizer 1519 performs the power saving operation control. The output of the PLL frequency synthesizer 1519 is subjected to band limitation in a band pass filter (BPF) 1523, and is amplified by a power amplifier 1524. The amplifier output is then sent to the antenna switch 1502. When the transmitter-receiver is in a transmission state, the antenna switch 1502 sends the signal B from the power amplifier 1524 to the antenna 1501. The transmission signal is then transmitted through the antenna 1501.

As described above, this embodiment of the present invention provides a transmitter-receiver including a PLL frequency synthesizer provided with a phase comparator unit of the present invention. Although the present invention is applied to a transmitter-receiver in this embodiment, the application of the present invention is not limited to it. The present invention can be applied to transceivers, communication devices, radio receivers, television receivers, portable telephones, and others.

The present invention is not limited to the specifically disclosed embodiments, but variations and modifications may be made without departing from the scope of the present invention.

The present application is based on Japanese priority application No. 11-120620, filed on Apr. 27, 1999, the entire contents of which are hereby incorporated by reference.

What is claimed is:

1. A method of controlling a power saving operation for a phase comparator unit, comprising the steps of:

dividing a frequency of a reference signal to generate a reference frequency divided signal;

dividing a frequency of an input signal to generate a comparison frequency divided signal a phase of which is to be compared with a phase of the reference frequency divided signal;

comparing the phases of the reference frequency divided signal and the comparison frequency divided signal so as to output a comparison result;

generating a power saving state canceling signal in accordance with the reference frequency divided signal and the comparison frequency divided signal;

generating a first initializing signal for initializing the output of the step of dividing the frequency of the reference signal in accordance with the power saving state canceling signal; and generating a second initializing signal for initializing the output of the step of dividing the frequency of the input signal in accordance with the power saving state canceling signal.

2. The method as claimed in claim 1, wherein frequency dividing rates used in the step of dividing the frequency of the reference signal and in the step of dividing the frequency of the input signal can be set independently of each other.

3. A power saving operation control circuit for a phase comparator unit, comprising:

a reference signal frequency dividing unit which divides a frequency of a reference signal to generate a reference frequency divided signal;

a comparison signal dividing unit which divides a frequency of an input signal to generate a comparison frequency divided signal whose phase is to be compared with a phase of the reference frequency divided signal;

a phase comparator which compares phases of the reference frequency divided signal and the comparison frequency divided signal so as to output a comparison result;

a canceling signal generator which generates a power saving state canceling signal in accordance with the reference frequency divided signal and the comparison frequency divided signal;

a first initializing signal generator which generates a first initializing signal for initializing the reference signal frequency dividing unit in accordance with the power saving state canceling signal; and a second initializing signal generator which generates a second initializing signal for initializing the comparison signal frequency dividing unit in accordance with the power saving state canceling signal.

4. The power saving operation control circuit as claimed in claim 3, wherein frequency dividing rates used in the reference signal frequency dividing unit and in the comparison signal frequency dividing unit can be set independently of each other.

5. A PLL frequency synthesizer comprising:

a phase comparator unit;

a loop filter which receives an output of the phase comparator unit; and a voltage controlled oscillator which receives an output of the loop filter, the phase comparator unit comprising:

a reference signal frequency dividing unit which divides a frequency of a reference signal to generate a reference frequency divided signal;

a comparison signal dividing unit which divides a frequency of an output signal of the voltage controlled oscillator to generate a comparison frequency divided signal a phase of which is to be compared with a phase of the reference frequency divided signal;

a phase comparator which compares the phases of the reference frequency divided signal and the comparison frequency divided signal so as to output a comparison result;

a canceling signal generator which generates a power saving state canceling signal in accordance with the reference frequency divided signal and the comparison frequency divided signal;

a first initializing signal generator which generates a first initializing signal for initializing the reference signal frequency dividing unit in accordance with the power saving state canceling signal; and a second initializing signal generator which generates a second initializing signal for initializing the comparison signal frequency dividing unit in accordance with the power saving state canceling signal.

6. The PLL frequency synthesizer as claimed in claim 5, wherein frequency dividing rates used in the reference signal frequency dividing unit and in the comparison signal frequency dividing unit can be set independently of each other.

7. A semiconductor integrated circuit including a PLL frequency synthesizer comprising:

a phase comparator unit;

a loop filter which receives an output of the phase comparator unit; and a voltage controlled oscillator which receives an output of the loop filter, the phase comparator unit comprising:

a reference signal frequency dividing unit which divides a frequency of a reference signal to generate a reference frequency divided signal;

a comparison signal dividing unit which divides a frequency of an output signal of the voltage controlled oscillator to generate a comparison frequency divided signal a phase of which is to be compared with a phase of the reference frequency divided signal;

a phase comparator which compares the phases of the reference frequency divided signal and the comparison frequency divided signal so as to output a comparison result;

a canceling signal generator which generates a power saving state canceling signal in accordance with the reference frequency divided signal and the comparison frequency divided signal;

a first initializing signal generator which generates a first initializing signal for initializing the reference signal frequency dividing unit in accordance with the power saving state canceling signal; and a second initializing signal generator which generates a second initializing signal for initializing the comparison signal frequency dividing unit in accordance with the power saving state canceling signal.

8. The semiconductor integrated circuit as claimed in claim 7, wherein frequency dividing rates used in the reference signal frequency dividing unit and in the comparison signal frequency dividing unit can be set independently of each other.

9. A transmitter-receiver including a PLL frequency synthesizer comprising:

a phase comparator unit;

a loop filter which receives an output of the phase comparator unit; and a voltage controlled oscillator which receives an output of the loop filter, the phase comparator unit comprising:

a reference signal frequency dividing unit which divides a frequency of a reference signal to generate a reference frequency divided signal;

a comparison signal dividing unit which divides a frequency of an output signal of the voltage controlled oscillator to generate a comparison frequency divided signal a phase of which is to be compared with a phase of the reference frequency divided signal;

a phase comparator which compares the phases of the reference frequency divided signal and the comparison frequency divided signal so as to output a comparison result;

a canceling signal generator which generates a power saving state canceling signal in accordance with the reference frequency divided signal and the comparison frequency divided signal;

a first initializing signal generator which generates a first initializing signal for initializing the reference signal frequency dividing unit in accordance with the power saving state canceling signal; and a second initializing signal generator which generates a second initializing signal for initializing the comparison signal frequency dividing unit in accordance with the power saving state canceling signal.

10. The transmitter-receiver as claimed in claim 9, wherein frequency dividing rates used in the reference signal frequency dividing unit and in the comparison signal frequency dividing unit can be set independently of each other.

11. A method of controlling a power saving operation for a phase comparator unit, comprising the steps of:

dividing a frequency of a reference signal to generate a reference frequency divided signal;

dividing a frequency of an input signal to generate a comparison frequency divided signal a phase of which is to be compared with a phase of the reference frequency divided signal;

comparing the phase of the reference frequency divided signal and the comparison frequency divided signal so as to output a comparison result;

generating a power saving state canceling signal with the reference frequency divided signal so as to output a comparison result; and generating an initializing signal for initializing the dividing of the frequency of the reference signal or the frequency of the input signal in accordance with the power saving state canceling signal.

* * * * *